United States Patent [19]

McCartney

[11] Patent Number: 5,642,266
[45] Date of Patent: Jun. 24, 1997

[54] APPARATUS FOR MAINTAINING AN ELECTRICAL COMPONENT IN A FIXED POSITION

[75] Inventor: John Charles McCartney, Newark, Ohio

[73] Assignee: Holophane Corporation, Newark, Ohio

[21] Appl. No.: 574,274

[22] Filed: Dec. 18, 1995

Related U.S. Application Data

[63] Continuation of Ser. No. 300,977, Sep. 6, 1994, abandoned.

[51] Int. Cl.$^6$ .............................. H05K 7/02; H05K 7/12
[52] U.S. Cl. ...................... 361/809; 361/760; 361/807
[58] Field of Search ..................... 174/52.4; 257/723, 257/724, 690, 691, 692, 693; 361/760, 772, 773, 774, 782, 783, 807, 809, 810, 811; 437/209; 439/68, 70, 83

[56] References Cited

U.S. PATENT DOCUMENTS

| | | | |
|---|---|---|---|
| 2,902,629 | 9/1959 | Little et al. | 361/772 |
| 3,503,033 | 3/1970 | Kennedy, Jr. | 361/773 |
| 5,373,276 | 12/1994 | Suppelsa et al. | 361/773 |

FOREIGN PATENT DOCUMENTS 196986  4/1958  Austria.

*Primary Examiner*—Donald Sparks
*Attorney, Agent, or Firm*—Brooks & Kushman P.C.

[57] ABSTRACT

An apparatus (10) for maintaining an electrical component (22) in a substantially fixed position relative to a base (24) in an electrical assembly, the apparatus (10) being electrically isolated. The apparatus (10) includes a component retention portion (12) adapted for contact with the component (22), a base retention portion (14) adapted for attachment to the base (24), and a variable portion (16) between the component retention portion (12) and the base retention portion (14), the variable portion (16) being adjustable to the size of the component (22).

20 Claims, 2 Drawing Sheets

APPARATUS FOR MAINTAINING AN ELECTRICAL COMPONENT IN A FIXED POSITION

CROSS-REFERENCE TO RELATED APPLICATION

This application is a continuation of U.S. patent application Ser. No. 08/300,977, filed on Sep. 6, 1994, entitled "RETENTION APPARATUS FOR AN ELECTRICAL COMPONENT", now abandoned which is assigned to the assignee of the present application and which is hereby incorporated by reference.

TECHNICAL FIELD

This invention relates to an apparatus for retaining an electrical component, such as a capacitor or the like, in an electrical assembly.

BACKGROUND ART

Many electrical applications employ circuits requiring a wide variety of components. Depending upon the particular application involved, such as commercial or industrial lighting, some of those components can become relatively large. Such larger components, like capacitors, cannot be formed as part of an integrated circuit board. Instead, such components are manufactured separately for attachment to the circuit board, electrical plate, or the like at a later time via soldering or various forms of hardwiring.

As a result, unlike integral components, larger electrical components are at risk for detachment from the circuit board or the like as a result of damage to the component solder joints or hardwiring. To prevent this, and to help maintain larger components such as capacitors or the like in a substantially fixed position relative to the circuit board or the like, retention straps or brackets are often utilized.

Typically, such brackets are formed from an integral piece of rigid material and include a base portion, a retention portion, and an intermediated portion interposed between the retention and base portions. The base portion is generally adapted to receive a fastener, such as a rivet or screw, for attaching the base portion to the circuit board or the like. In that regard, the base portion is positioned adjacent the component and parallel to the circuit board or the like.

The retention portion is adapted to contact the component, typically at the distal end thereof. The retention portion serves to retain the component via friction resulting from its contact therewith. However, the retention portion may also be adapted to receive a fastener for attaching the retention portion directly to the component. Like the base portion and the circuit board or the like, the retention portion is parallel to the surface of the distal end of the component.

The intermediate portion serves to attach the base and retention portions and typically runs the length of the component along one side thereof. As a result, the intermediate portion is usually sized to fit the particular component for which the retention bracket is intended. However, where the bracket is attached to the circuit board or the like via a mounting screw, different length screws may also be used to properly fit the bracket to the length of the component involved.

While such retention brackets are generally adequate for maintaining an electrical component in a substantially fixed position relative to a circuit board or the like, they nonetheless suffer from various problems. First and foremost among such problems is a lack of universality. That is, because the brackets are rigid, either the bracket or the mounting screw involved must be specially manufactured or chosen such that the bracket may properly fit the component involved. This, in turn, leads to higher costs.

Moreover, even with such a bracket, the component involved is still at risk for detachment from the circuit board or the like. That is, because the bracket supports the component only along one side thereof, the bracket does not afford the component the same measure of protection from forces exerted on the component from different directions, which result in the solder joint or hardwiring damage mentioned above.

Thus, there exists a need for an improved apparatus for maintaining an electrical component in a substantially fixed position relative to a circuit board or the like. Such an apparatus would be adapted for use with components having a variety of sizes and would afford such components generally uniform protection from forces exerted thereon.

DISCLOSURE OF INVENTION

According to the present invention, then, an apparatus is provided for use in an electrical assembly, the apparatus for maintaining an electrical component in a substantially fixed position relative to a base. In that regard, the apparatus comprises a component retention portion adapted for contact with the component, a base retention portion adapted for attachment to the base, and a variable portion interposed between the component retention portion and the base retention portion, the variable portion being adjustable to the size of the component.

More particularly, according to the present invention, an apparatus is provided for maintaining a capacitor in a substantially fixed position relative to a circuit board, the apparatus comprising a capacitor retention portion adapted for contact with the capacitor and a base retention portion adapted to receive a fastener for attaching the base retention portion to the circuit board. The apparatus further more particularly comprises a helical spring interposed between the capacitor retention portion and the base retention portion, the spring being adjustable to the length of the capacitor and having a diameter such that the spring surrounds the capacitor.

Preferably, the component retention portion, base retention portion and spring of the apparatus of the present invention are formed from an integral piece of wire. Further, the base retention portion of the apparatus of the present invention preferably comprises substantially closed loop in that wire for receiving the fastener described above.

Accordingly, it is the principle object of the present invention to provide an improved apparatus for maintaining an electrical component in a substantially fixed position relative to a base, such as a circuit board or the like.

Another object of the present invention is to provide an improved apparatus for maintaining an electrical component in a substantially fixed position relative to a circuit board or the like that is simple in design and inexpensive to manufacture.

Still another object of the present invention is to provide an apparatus for maintaining an electrical component in a substantially fixed position relative to a circuit board or the like that affords such components generally uniform protection from forces exerted thereon.

Yet another object of the present invention is to provide an apparatus for maintaining an electrical component in a substantially fixed position relative to a circuit board or the like that is adapted for use with components having a variety of sizes.

BEST MODE FOR CARRYING OUT THE INVENTION

Figure 1:
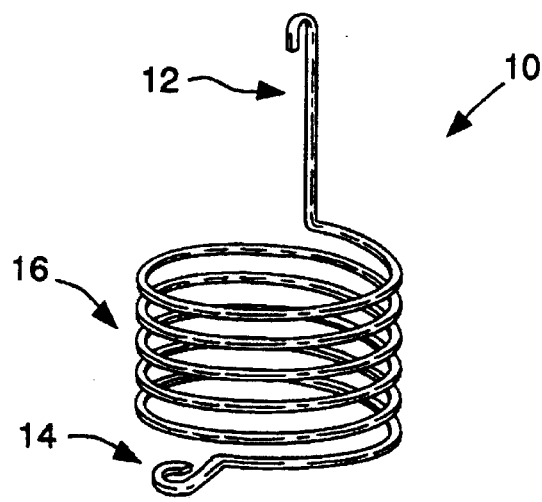
FIG. 1 is perspective view of the retention apparatus of the present invention.

Referring first to FIG. 1, the apparatus of the present invention for maintaining an electrical component in a substantially fixed position relative to a base is shown in perspective view, denoted generally by reference numeral 10. As seen therein, the apparatus (10) comprises a component retention portion (12), a base retention portion (14), and a variable portion (16) interposed between the component retention portion (12) and the base retention portion (14).

Figure 2:
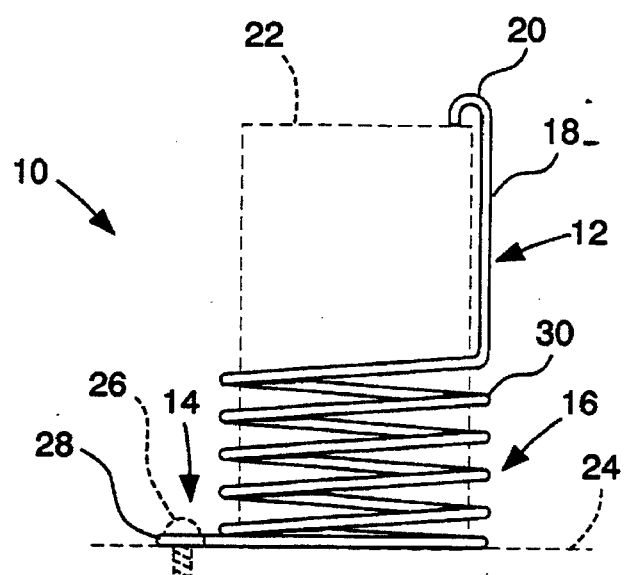
FIG. 2 is a side view of the retention apparatus of the present invention.
Figure 3:
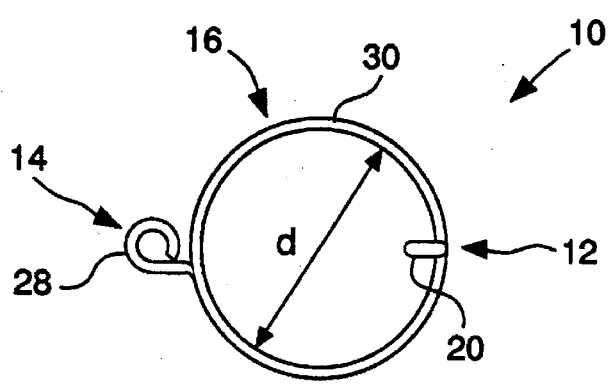
FIG. 3 is a top view of the retention apparatus of the present invention.

Referring next to FIGS. 2 and 3, side and top views of the apparatus (10) of the present invention are shown, respectively. As seen in FIG. 2, the component retention portion (12) preferably comprises an elongated member (18) having a first end connected to the variable portion (16) and a second end having a retention flange (20) for contacting and retaining an electrical component (22), shown in phantom, which is attached to base (24), also shown in phantom, via electrical leads and/or solder joints (not shown). Such contact between retention flange (20) and electrical component (22) is merely physical, not electrical, contact. Indeed apparatus (10) is electrically isolated from component (22) so as not to affect the function of component (22) or the circuit of which component (22) is a part. Electrical component (22) may be a capacitor or any other type of component requiring an apparatus, such as that of the present invention, for maintaining that component (22) in a substantially fixed position relative to the base (24).

As described in greater detail below, component retention portion (12), base retention portion (14), and variable portion (16) are preferably formed from an integral piece of wire. In that regard, retention flange (20) preferably comprises a hook or bend in that wire at the second end of elongated member (18) such that retention flange (20) contacts the outer surface of component (22), thereby retaining component (22) in a substantially fixed position relative to base (24) via frictional forces. This is best accomplished when retention flange (20) contacts the surface of component (22) that is substantially parallel to the surface of base (24). To ensure electrical isolation of apparatus (10) from electrical component (22), the wire may be coated with an insulator. Alternatively, component retention portion (12), base retention portion (14), and variable portion (16) may be formed from an integral non-conductor.

However, as with prior art component retention straps or brackets, retention flange (20) may also be adapted to receive a fastener of any type for attaching retention flange (20) directly to any surface of component (22). Likewise, as is readily apparent to those of ordinary skill in the art, retention flange (20) may be any suitable member such as a plate extending from elongated member (12) or simply the second end of elongated member (12) itself, for attachment to component (22) in any suitable manner, such as gluing. Finally, as is also readily apparent to those of ordinary skill, elongated member (18) of component retention portion (12) may be omitted entirely, such that component retention portion (12) comprises retention flange (20), which is connected directly to variable portion (16), described in greater detail below.

As seen in FIGS. 2 and 3, the base retention portion (14) is adapted to receive a fastener (26), again shown in phantom, for attaching the base retention portion (14) to the base (24). Fastener (26) is preferably an ordinary mounting screw, but may be a rivet or any other suitable device. Similarly, base (24) may be any type of electrical plate, such as a circuit board or the like.

Once again, as described in greater detail below, component retention portion (12), base retention portion (14), and variable portion (16) are preferably formed from an integral piece of wire. In that regard, base retention portion (14) preferably comprises a substantially closed loop (28) in that wire, the loop (28) being adapted to receive fastener (26), such as a mounting screw, rivet, or the like. However, as is readily apparent to those of ordinary skill in the art, base retention portion (14) may be any suitable member, such as a plate or simply the distal end of base retention member (14) itself, for attachment to base (24) in any suitable manner, such as gluing or soldering.

As seen in FIGS. 1 and 2, variable portion (16) preferably comprises a helical spring (30). Once again, as previously described, component retention portion (12), base retention portion (14) and variable portion (16) are preferably formed from an integral piece of wire. In that regard, variable portion (16) is thus preferably wound into spring (30) from the wire employed in the apparatus (10) of the present invention.

Referring now to FIGS. 2 and 3, spring (30) forming variable portion (16) is provided with a diameter (d) such that spring (30) surrounds component (22) when installed therewith on base (24). In such a fashion, the apparatus (10) of the present invention provides component (22) with generally uniform protection from any forces which may be exerted thereon and result in damage to the electrical leads and/or solder joints associated with component (22). The apparatus (10) of the present invention thus solves the problem of non-uniform protection against external forces associated with prior art component retention brackets or straps detailed above.

Moreover, spring (30) forming variable portion (16) is also capable of expansion such that the apparatus (10) of the present invention is capable of adjusting to and accommodating components (22) of varying sizes and lengths. As is readily apparent to those of ordinary skill in the art, such adjustment to components (22) of different sizes and lengths is automatic as a result of the variable portion (16) comprising spring (30). In such a fashion, the apparatus (10) of the present invention solves the lack of universality problem associated with prior art component retention brackets or straps detailed above.

Referring now to FIG. 2, the preferred embodiment of the apparatus (10) of the present invention is shown in operation. As seen therein, base retention portion (14) is attached to base (24) via mounting screw (26) and loop (28) so that spring (30) forming variable portion (16) surrounds component (22), and so that retention flange (20) extending from elongated member (18) of component retention portion (12)

contacts the top surface of component (22). In that regard, the spring constant of spring (30) forming variable portion (16) should be sufficient to provide a retaining force to component (22) via retention flange (20) without damaging component (22) or the component solder joints or hardwiring (not shown).

As mentioned above, and as depicted in FIGS. 1–3, component retention portion (12), base retention portion (14) and variable portion (16) are preferably formed from an integral piece of wire. The wire itself is pre-turned and preferably has a zinc plated finish. The wire should be of sufficient gauge to adequately retain and protect electrical component (22), as described above in regard to variable portion (16), yet fit within the confined spatial parameters of an ordinary circuit board or the like.

Figure 4:
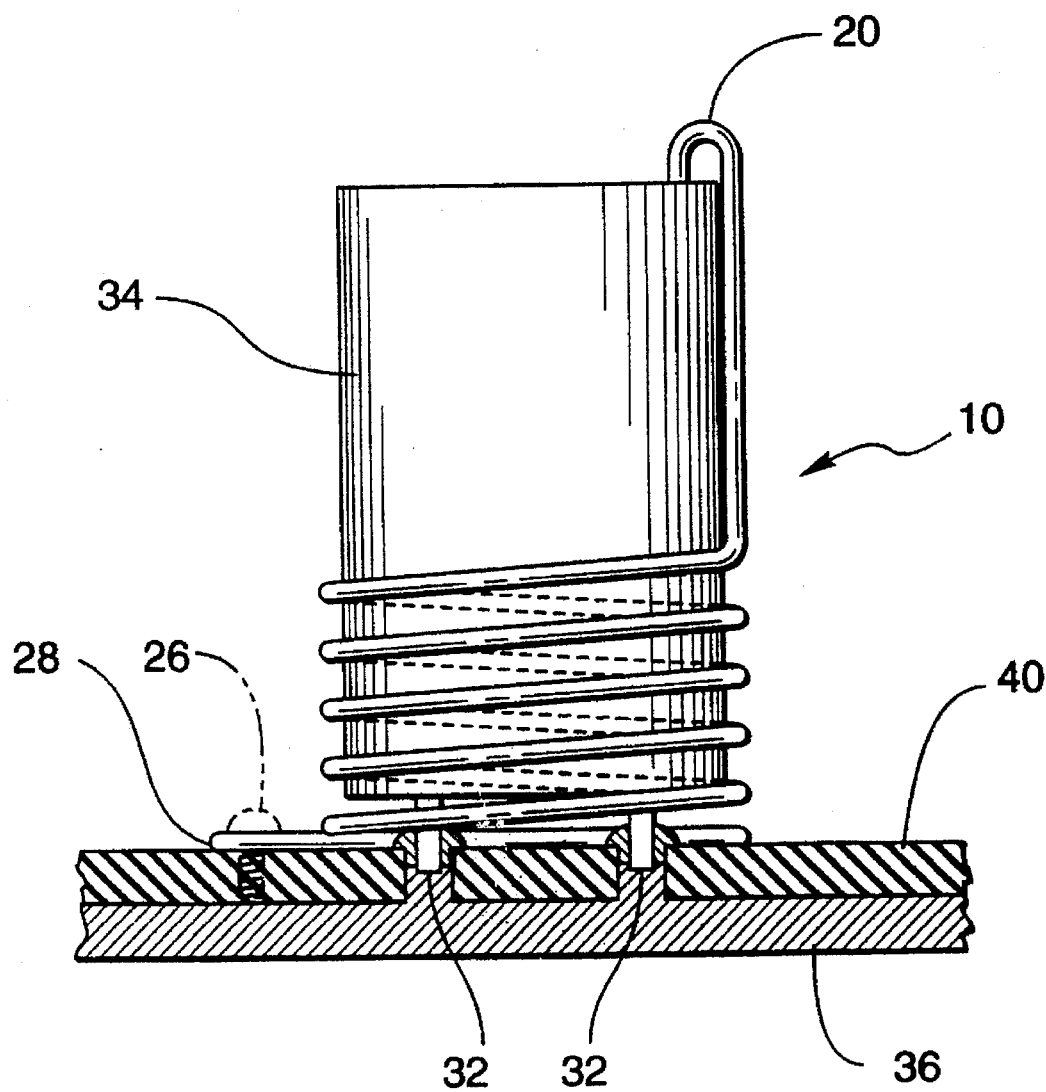
FIG. 4 is a partial side view illustrating the electrically isolated nature of the apparatus of the present invention.

As illustrated in FIG. 4, component (22) is shown as a capacitor having two leads (32) which are provided in electrical communication with the base (24), shown as a circuit board. Component (22) is also provided with an insulated exterior sheath (34). The leads (32) are preferably inserted into the circuit board (24), and then soldered in place to maintain electrical communication with a conductive layer (36) thereof. Apparatus (10) is electrically isolated from component (22) and circuit board (24) as retention flange (20) contacts the insulated exterior sheath (34) and loop (28) attaches to the non-conductive layer (40) of the circuit board (24) via fastener (26). Therefore, no circuit is created between apparatus (10) and the component (22) or the circuit board (24).

As is readily apparent from the foregoing detailed description, the present invention provides an improved apparatus (10) for maintaining an electrical component (22) in a substantially fixed position relative to a base (24), such as a circuit board or the like, that is simple in design and inexpensive to manufacture. Moreover, the apparatus (10) of the present invention further affords such components (22) generally uniform protection from forces exerted thereon. Finally, the apparatus (10) of the present invention is also adapted for use with components (22) having a variety of sizes.

The apparatus (10) of the present invention has been described and shown herein in conjunction with the retention of a capacitor to an electronic circuit board. However, it should be readily apparent that the apparatus (10) of the present invention is suitable for use in any application wherein the retention of any electrical component to any type of electrical plate or the like may be required.

It is to be understood that the present invention has been described in its preferred embodiment in an illustrative manner, and that the terminology which has been used is intended to be in the nature of words of description rather than of limitation. Obviously, many modifications and variations of the present invention are possible in light of the above teachings. Therefore, it is also to be understood that, within the scope of the following claims, the invention may be practiced otherwise than as specifically described.

What is claimed is:

1. In an electrical assembly, an electrically isolated apparatus for maintaining an electrical component in a substantially fixed position relative to a base, the apparatus comprising:

a component retention portion adapted for contact with the component;

a base retention portion adapted for attachment to the base; and a variable portion interposed between the component retention portion and the base retention portion, the variable portion being adjustable to the size of the component.

2. The apparatus of claim 1 wherein the component retention portion comprises an elongated member having a first end connected to the variable portion and a second end having a retention flange for contacting the component.

3. The apparatus of claim 1 wherein the base retention portion is adapted to receive a fastener for attaching the base retention portion to the base.

4. The apparatus of claim 1 wherein the variable portion automatically adjusts to the size of the component.

5. The apparatus of claim 4 wherein the variable portion comprises a helical spring having a diameter such that the variable portion surrounds the component.

6. The apparatus of claim 1 wherein the component retention portion, base retention portion and variable portion are formed from an integral piece.

7. The apparatus of claim 6 wherein the integral piece comprises a wire.

8. The apparatus of claim 7 wherein the base retention portion comprises a substantially closed loop in the wire, the loop adapted to receive a fastener for attaching the base retention portion to the base.

9. The apparatus of claim 1 wherein the electrical component comprises a capacitor.

10. The apparatus of claim 1 wherein the base comprises a circuit board.

11. In an electrical assembly, an electrically isolated apparatus for maintaining an electrical component in a substantially fixed position relative to a circuit board, the apparatus comprising:

a component retention portion adapted for contact with the component;

a base retention portion adapted for attachment to the circuit board; and a helical spring interposed between the component retention portion and the base retention portion, the spring being adjustable to the length of the component and having a diameter such that the spring surrounds the component.

12. The apparatus of claim 11 wherein the component retention portion comprises an elongated member having a first end connected to the spring and a second end having a retention flange for contacting the component.

13. The apparatus of claim 11 wherein the base retention portion is adapted to receive a fastener for attaching the base retention portion to the circuit board.

14. The apparatus of claim 11 wherein the component retention portion, base retention portion and spring are formed from an integral piece.

15. The apparatus of claim 14 wherein the integral piece comprises a wire.

16. The apparatus of claim 15 wherein the base retention portion comprises a substantially closed loop in the wire, the loop adapted to receive a fastener for attaching the base retention portion to the base.

17. The apparatus of claim 11 wherein the electrical component comprises a capacitor.

18. In an electrical assembly, an electrically isolated apparatus for maintaining a capacitor in a substantially fixed position relative to a circuit board, the apparatus comprising:

a capacitor retention portion adapted for contact with the capacitor;

a base retention portion adapted to receive a fastener for attaching the base retention portion to the circuit board; and a helical spring interposed between the capacitor retention portion and the base retention portion, the spring being adjustable to the length of the capacitor and having a diameter such that the spring surrounds the capacitor.

19. The apparatus of claim 18 wherein the component retention portion, base retention portion and spring are formed from an integral piece of wire.

20. The apparatus of claim 19 wherein the base retention portion comprises a substantially closed loop in the wire.

* * * * *